United States Patent [19]

Carpenter, Jr. et al.

[11] Patent Number: 5,498,765
[45] Date of Patent: Mar. 12, 1996

[54] POSITIVE PHOTORESIST COMPOSITION CONTAINING PHOTOACID GENERATOR AND USE THEREOF

[75] Inventors: Burton J. Carpenter, Jr.; Michael G. McMaster; Joseph LaTorre, all of Austin, Tex.; Logan L. Simpson, Apalachin, N.Y.

[73] Assignee: International Business Machines Corporation, Armonk, N.Y.

[21] Appl. No.: 311,027

[22] Filed: Sep. 26, 1994

Related U.S. Application Data

[62] Division of Ser. No. 41,460, Apr. 2, 1993, Pat. No. 5,374,500.

[51] Int. Cl.⁶ ................ G03F 7/30; G03F 7/40
[52] U.S. Cl. ............. 430/323; 430/326; 430/329
[58] Field of Search ................... 430/323, 326, 430/329, 270, 910, 914, 909, 905, 277; 522/25, 26

[56] References Cited

U.S. PATENT DOCUMENTS

| | | | |
|---|---|---|---|
| 5,055,439 | 10/1991 | Allen et al. | 502/158 |
| 5,252,427 | 10/1993 | Bauer et al. | 430/270 |
| 5,272,042 | 12/1993 | Allen et al. | 430/270 |
| 5,279,923 | 1/1994 | Hiro et al. | 430/270 |
| 5,403,695 | 4/1995 | Hayase et al. | 430/326 |

*Primary Examiner*—Janis L. Dote
*Attorney, Agent, or Firm*—Pollock, Vande Sande & Priddy

[57] ABSTRACT

A positive acting photoresist comprising a film forming reactive polymer; an iodonium initiator or a non-ionic compound that generates triflic acid upon exposure to radiation; and a multifunctional organic carboxylic acid is provided as well as use thereof.

13 Claims, No Drawings

POSITIVE PHOTORESIST COMPOSITION CONTAINING PHOTOACID GENERATOR AND USE THEREOF

This is a divisional application of Ser. No. 08/041,460, filed on Apr. 2, 1993 now issued U.S. Pat. No. 5,374,500.

DESCRIPTION

1. Technical Field

The present invention relates generally to mixtures of polymers and iodonium photoacid generators or non-ionic triflic acid generators used in resist compositions and, more specifically, to improved photoresist compositions for use in printed circuit board manufacture which function via an acid-catalyzed deprotection mechanism. More particularly, multifunctional organic carboxylic acids are employed in the compositions of the present invention to substantially reduce, if not entirely eliminate undevelopable resist and aid in the strippability of the resist.

2. Background Art

The design of chemically amplified resist systems based on acid-catalyzed chain reactions (e.g., polymerization, depolymerization, side chain- cleavage, etc.) has been recognized as a viable route to-high sensitivity resist systems in microlithography. Such systems are described in, e.g., Polymers In Electronics, Davidson T. Ed., ACS Symposium Series 242, American Chemical Society, Washington, D.C., 1984, page 11, H. Ito, C. G. Willson. These systems offer the high sensitivity attendant with chemical amplification but avoid the drawbacks of free radical based systems. Systems of this type are capable of high resolution, i.e., submicron in the case of semiconductor applications. Since they are oxygen insensitive, they can be applied in liquid form as thin films.

Photoresists which function via an acid-catalyzed deprotection mechanism utilize polymers which are positive acting. That is, the unexposed resist is insoluble in the developer, but is converted into a soluble material upon exposure. Chemically, this is accomplished by changing the side group chemistry through thermal cleavage, a reaction which is acid-catalyzed. Compounds such as iodonium salts generate acid upon photo or thermally induced decomposition. These materials are typically sensitized to the desired wavelengths with an appropriate dye.

However, the use of iodonium salts and non-ionic triflic acid generators in positive acting photoresists on copper surfaces has been impractical due to the formation of an undevelopable layer of resist at the copper surface in the exposed regions. Additionally, photoresists have often proved difficult to strip in standard basic aqueous solutions such as sodium hydroxide. Attempts to overcome these problems have included copper passivation methods, such as electroless chrome or nickel treatments, or the use of alternative photoacid generators, such as sulfonium salts. Unfortunately, the copper passivation methods were impractical since they involved additional process steps and often utilized toxic materials. Similarly, sulfonium salts did not perform well because they are difficult to sensitize to visible light resulting in low photospeeds.

SUMMARY OF INVENTION

It is therefore an object of the present invention to provide a positive photosensitive resist composition containing an iodonium initiator or a non-ionic triflic acid generator, but which does not suffer from the above problem of formation of undevelopable resist at the copper surface in exposed regions.

It has been found pursuant to the present invention that the use of multifunctional organic carboxylic acids as additives in positive acting photoresist formulations enables their use on copper alloys, where these photoresists employ an iodonium initiator and/or a non-ionic triflic acid generator. Such can be used on copper and copper alloy surfaces without the appearance of residual resist.

Moreover, it has been found pursuant to the present invention that the preferred acid, citric acid, rendered the resist more soluble in the stripping solution without adversely affecting the robustness of the unexposed areas in the developing solution.

More particularly, the present invention is concerned with a positive photosensitive resist composition that comprises a film forming reactive polymer containing groups which react upon acid catalysis;

an iodonium initiator which generates acid or a non-ionic photoacid generator that generates triflic acid upon exposure to radiation thereby producing acid catalysis of the film forming reactive polymer; and a multifunctional organic carboxylic acid.

In addition, the present invention is concerned with the use of the above compositions on copper and copper alloy substrates.

BEST AND VARIOUS MODES FOR CARRYING OUT THE INVENTION

The present invention is concerned with a positive photosensitive resist composition that comprises a film forming reactive polymer containing groups which react upon acid catalysis; and an initiator which generates acid upon exposure to radiation, thereby producing acid catalysis of the film forming reactive polymer. The initiator employed is an iodonium initiator or a non-ionic photoacid generator that generates triflic acid. The addition of a multifunctional organic carboxylic acid such as oxalic acid and preferably citric acid to such photoresist compositions has been found to avoid the formation of undevelopable resist in exposed regions on copper-containing surfaces and to render the resist more soluble in basic aqueous developing solutions. By multifunctional, it is understood that the acid employed contains two or more carboxylic acid groups.

The acid sensitive substance into which the initiator and citric acid are incorporated can be a suitable film forming reactive polymer. Acid-sensitive substances useful in the practice of the present invention include, for example, epoxies, poly(tert-butylmethacrylate), poly(tert-butoxy carbonyloxystyrene), poly(phthaldehyde), condensation polymers of bisphenol A with carbonyloxy derivatives of tertiary diols, copolymers and terpolymers of the above and the bis(tertbutoxycarbonyl) derivative of bisphenol A.

Preferably, the film forming reactive polymer is comprised of the following polymerizable units:

a first monomer which contributes acid sensitive groups pendant on the polymer backbone, the first monomer being selected from the group consisting of tertiary butylacrylate and tertiary butylmethacrylate, and combinations thereof;

a second monomer which is selected from the group consisting of alkylmethacrylates, alkylacrylates and combinations thereof;

a third monomer selected from the group consisting of acrylic acid and methacrylic acid and combinations thereof.

Examples of such polymers include the terpolymer of tertiary butyl methacrylate/methyl methacrylate/methacrylic acid and tetrapolymer of ethyl acrylate/methyl methacrylate/ tertiary butyl acrylate/acrylic acid.

Acid sensitive polymers of the above type will be familiar to those skilled in the art and are readily prepared using known techniques. For instance, methacrylate and acrylate homopolymers and copolymers are synthesized by free radical solution polymerization. The choice of polymerization solvent is governed by factors such as solubility of the monomers, the nature of the initiators and formed polymer, boiling point, and cost. A variety of azo and peroxide initiators can be used to initiate the polymerization. Choice of monomers is dependent upon the desired polymer properties. In a typical synthesis, a reactor is charged with solvent (e.g., tetrahydrofuran and methylethyl ketone) and the desired monomers such that the formed polymer, assuming 100% conversion, attains a final concentration of 10 to 50%. (wt./wt.). The initiator is 0.05% to 1.0% (vs. monomer) depending on the desired molecular weight. The system is sparged with nitrogen to remove oxygen. The polymerization is typically run at 60° to 80° C. for 10 to 24 hours. The polymer is isolated by precipitation into a nonsolvent (hydrocarbon or water) and collected and dried at elevated temperatures under vacuum. The polymer component of the photoresist compositions of the present invention is generally present in the range from about 99 to about 80% by weight, based on the total weight of the solids of the photoresist composition.

The photoacid generators or initiators useful in the present invention are compounds which produce triflic acid or iodonium compounds which produce strong acids upon exposure to radiation. The preferred photoacid generators or initiators are triflic acid generators and substituted and unsubstituted diaryliodonium salts. Compounds that generate triflic acid include iodonium salts such as diphenyliodonium triflate and di(t-butyl phenyl) iodonium triflate; and non-ionic compounds such as phthalimide triflate.

Mixtures of diphenyl-iodonium triflate, di(t-butylphenyl) iodonium triflate, or phthalimide triflate can be used.

Aromatic iodonium salts which can be employed in accordance with this invention thus include those having the formulae:

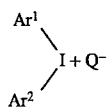

wherein
$Ar^1$ and $Ar^2$ are aromatic groups having 4 to 20 carbon atoms and are preferably selected from phenyl. naphthyl, thienyl, and furanyl groups; and $Q^-$ is any anion, but preferably is an anion selected from tetrafluoroborate, hexafluorophosphate, hexafluoroarsenate, hexafluoroantimonate, trifluoromethanesulfonate or trifluoroacetate.

Amongst the useful iodonium salts are particularly included:
diphenyliodonium hexafluoroarsenate
diphenyl iodonium hexafluoroantimonate
diphenyl iodonium hexafluorophosphate
diphenyliodonium trifluoroacetate
4-trifluoromethylphenylphenyliodonium tetrafluoroborate
ditolyliodonium hexafluorophosphate
di(4-methoxyphenyl)iodonium hexafluoroantimonate
diphenyliodonium trifluoromethane sulfonate
di (t-butylphenyl) iodonium hexafluoroantimonate
di(t-butylphenyl) iodonium trifluoromethane sulfonate
(4-methylphenyl)phenyliodonium tetrafluoroborate
di-(2,4-dimethylphenyl)iodonium hexafluoroantimonate
di-(4-t-butylphenyl)iodonium hexafluoroantimonate
2,2'-diphenyliodonium hexafluorophosphate The photoacid generator or initiator is generally present in the range from about 1 to about 20% by weight, based upon the weight of solids in the resist composition.

The resist is also typically sensitized to the desired wavelength with an appropriate dye. For instance, where the resist is desired to be sensitized toward the visible spectrum, a sensitizer component such as that described in U.S. Pat. No. 5,055,439, issued Oct. 8, 1991, entitled Photoacid Generating Composition and Sensitizer Therefore, assigned to the assignee of the present invention, can be incorporated. As an example, the preferred sensitizer in such cases for sensitization of the acid generator toward visible argon laser wavelengths (about 488 to 514 nm) is 1,8-dimethoxy- 9,10-bis (phenylethynyl) anthracene.

According to the present invention, citric acid is employed in the photoresist compositions to substantially reduce, if not entirely eliminate undevelopable resist and aid in the strippability of the resist in caustic or basic aqueous solutions.

The acid is typically present in amounts of about 0.1 to about 5% by weight and preferably about 1 to about 3% by weight, based upon the weight of the solids in the resist composition.

Typical film thickness of the composition are about 3 to about 50 mils and more typically about 5 to about 15 mils (dry).

The following non-limiting examples are intended to be illustrative of the invention:

EXAMPLE 1

About 100 parts by weight of phototerpolymer (tertiary butylmethacrylate/methylmethacrylate/methacrylic acid) are dissolved at 20% solids into a 50/50 mixture of cyclohexanone and propylene glycol monomethyl ether actetate (PGMEA). To this composition are added about 10 parts by weight of di(t-butyl phenyl) iodonium trillate; about 3 parts by weight of 8-dimethoxy 9,10-bis(phenylethynyl anthracene) and about 2 parts by weight of citric acid. The composition is then coated onto a copper clad epoxy-glass fiber laminate to a thickness of about 8 microns (dried).

Selective areas of the resist are then imagewise exposed using a conventional mercury lamp at 20 mJ/cm². The resist is then baked for about 25 minutes at 93° C., followed by developing in 100° F. 0.8% sodium carbonate for about 2 minutes. The exposed copper is then etched in 120° F. cupric chloride. The remaining unexposed photoresist is then stripped in 3% sodium hydroxide.

EXAMPLE 2

About 100 parts by weight of phototerpolymer (tertiary butylmethacrylate/methylmethacrylate/methacrylic acid) are dissolved at 20% solids into a 50/50 mixture of cyclohexanone and propylene glycol monomethyl ether actetate (PGMEA). To this composition are added about 10 parts by weight of di(t-butyl phenyl) iodonium triflate; about 3 parts by weight of 8-dimethoxy 9,10-bis(phenylethynyl anthracene) and about 0.5 parts by weight of oxalic acid. The composition is then coated onto a copper clad epoxy-glass fiber laminate to a thickness of about 8 microns (dried).

Selective areas of the resist are then imagewise exposed using a conventional mercury lamp at 20 mJ/cm$^2$. The resist is then baked for about 5 minutes at 110° C., followed by developing in 100° F., 0.8% sodium carbonate for about 2 minutes. The exposed copper is then etched in 120° F. cupric chloride. The remaining unexposed photoresist is then stripped in 3% sodium hydroxide.

What is claimed is:

1. A process for forming a pattern in a copper containing layer which comprises coating said copper containing layer with a photosensitive resist composition comprising:

a film forming reactive polymer containing groups which react upon acid catalysis;

an iodonium initiator which generates acid or a non-ionic photoacid generator that generates triflic acid upon exposure to radiation; and further comprising about 0.1 to about 5% by weight of citric acid based upon the weight of solids in the resist composition;

exposing selected areas of said composition to radiation, developing said composition by dissolving the exposed areas in a basic aqueous developing solution; thereby exposing areas of the copper containing layer; etching the areas of copper containing layer that are exposed; and then removing by stripping unexposed photoresist.

2. The process of claim 1 wherein the thickness of the photosensitive resist composition on said layer is about 5 to about 15 mils (dry).

3. The process of claim 1 wherein said stripping is carried out employing a basic aqueous solution.

4. The process of claim 1 wherein the amount of citric acid is about 1 to about 3% by weight based upon the weight of solids in the resist composition.

5. The process of claim 1 wherein the amount of said polymer is about 99 to about 80% by weight and said initiator is about 1 to about 20% by weight based upon the weight of solids in the resist composition.

6. The process of claim 1 wherein said initiator or photoacid generator is an iodonium salt.

7. The process of claim 1 wherein said initiator or photoacid generator produces triflic acid upon exposure to radiation.

8. The process of claim 1 wherein said initiator or photoacid generator is selected from the group consisting of diphenyl-iodonium triflate, di (t-butyl phenyl) iodonium trillate, phthalimide triflate and mixtures thereof.

9. The process of claim 1 wherein said composition further includes a sensitizer.

10. The process of claim 9 wherein said sensitizer is 1,8-dimethoxy 9,10-bis (phenyl ethynyl) anthracene.

11. The process of claim 1, wherein the film forming reactive polymer is comprised of the following polymerizable units:

a first monomer which contributes acid sensitive groups pendant on the polymer backbone, the first monomer being selected from the group consisting of tertiary butyl acrylate and tertiary butyl methacrylate, and combinations thereof;

a second monomer which is selected from the group consisting of alkyl methacrylates, alkyl acrylates and combinations thereof; and a third monomer selected from the group consisting of acrylic acid and methacrylic acid and combinations thereof.

12. The process of claim 1 wherein the film forming reactive polymer is tetrapolymer of ethyl acrylate/methyl methacrylate/tertiary butyl acrylate/acrylic acid.

13. The process of claim 1, wherein the film forming reactive polymer is terpolymer of tertiary butyl metyhacrylate/methyl methacrylate/methacrylic acid.

* * * * *